(12) United States Patent
Wang et al.

(10) Patent No.: US 10,804,305 B2
(45) Date of Patent: Oct. 13, 2020

(54) MANUFACTURE OF SEMICONDUCTOR MODULE WITH DUAL MOLDING

(71) Applicant: Sunny Opotech North America, Inc., Yuyao, Ningbo (CN)

(72) Inventors: Mingzhu Wang, Zhejiang (CN); Nan Guo, Zhejiang (CN); Zhenyu Chen, Zhejiang (CN); Bojie Zhao, Zhejiang (CN); Takehiko Tanaka, Zhejiang (CN); Feifan Chen, Zhejiang (CN); Ye Wu, Zhejiang (CN)

(73) Assignee: Sunny Opotech North America Inc., Yuyao, Ningbo (CN)

( * ) Notice: Subject to any disclaimer, the term of this patent is extended or adjusted under 35 U.S.C. 154(b) by 0 days.

(21) Appl. No.: 15/959,609

(22) Filed: Apr. 23, 2018

(65) Prior Publication Data

US 2019/0326342 A1 Oct. 24, 2019

(51) Int. Cl.
*H01L 27/146* (2006.01)
*H01L 31/0203* (2014.01)

(52) U.S. Cl.
CPC .. *H01L 27/14627* (2013.01); *H01L 27/14685* (2013.01); *H01L 31/0203* (2013.01)

(58) Field of Classification Search
CPC ......... H01L 27/14627; H01L 27/14685; H01L 31/0203
See application file for complete search history.

(56) References Cited

U.S. PATENT DOCUMENTS

| | | | | |
|---|---|---|---|---|
| 5,175,783 A * | 12/1992 | Tatoh | ................... | G02B 6/4202 250/227.11 |
| 5,937,279 A * | 8/1999 | Sawada | ............... | H01L 23/3142 438/123 |
| 6,002,592 A * | 12/1999 | Nakamura | .............. | H01L 24/82 174/50.54 |
| 6,036,908 A * | 3/2000 | Nishida | ............... | B29C 45/1671 264/254 |
| 6,414,384 B1 * | 7/2002 | Lo | ....................... | H01L 23/3128 257/685 |
| 6,835,596 B2 * | 12/2004 | Gotou | ............... | B29C 45/14655 264/272.17 |
| 7,176,055 B2 * | 2/2007 | Tsukahara | ........... | H01L 23/5389 257/E21.503 |
| 7,296,345 B1 * | 11/2007 | Wang | .................. | B29C 45/1671 29/832 |
| 8,184,449 B2 * | 5/2012 | Lee | ..................... | H01L 23/3128 257/685 |

(Continued)

*Primary Examiner* — Dale E Page
*Assistant Examiner* — Quovaunda Jefferson
(74) *Attorney, Agent, or Firm* — Sheppard Mullin Richter & Hampton LLP

(57) ABSTRACT

A method for manufacturing a semiconductor module for an image-sensing device is disclosed. The method may comprise forming a first molding component on a first surface of a printed circuit board (PCB); mounting at least a photosensitive member to a second surface of the PCB; and forming a second molding component on the second surface of the PCB. The PCB may comprise at least an electric component on the first surface of the PCB. The first molding component may encapsulate the at least one electric component with the PCB. The second molding component may secure the photosensitive member on the PCB.

10 Claims, 14 Drawing Sheets

(56) References Cited

U.S. PATENT DOCUMENTS

| | | | |
|---|---|---|---|
| 2004/0251509 A1* | 12/2004 | Choi | H01L 27/14618 257/432 |
| 2006/0065964 A1* | 3/2006 | Ohsumi | H01L 21/56 257/690 |
| 2007/0029569 A1* | 2/2007 | Andrews | H01L 33/52 257/99 |
| 2008/0122067 A1* | 5/2008 | Wang | H01L 23/4334 257/706 |

* cited by examiner

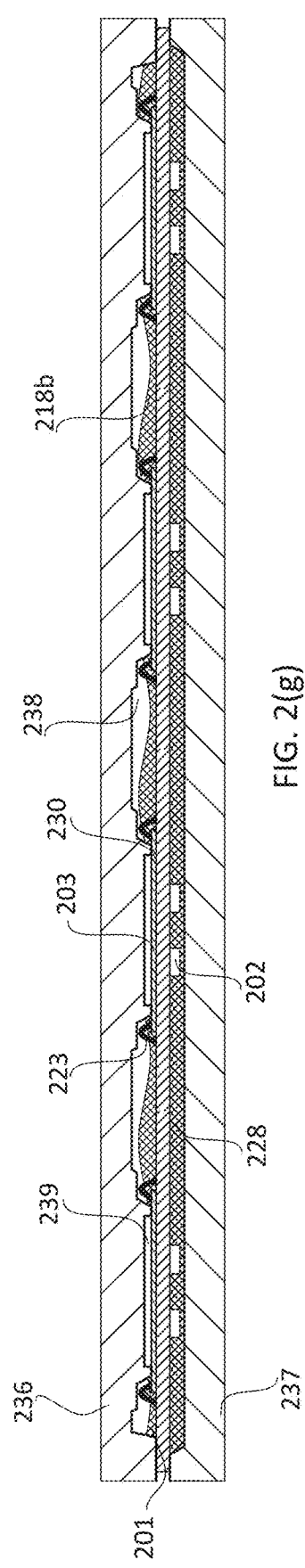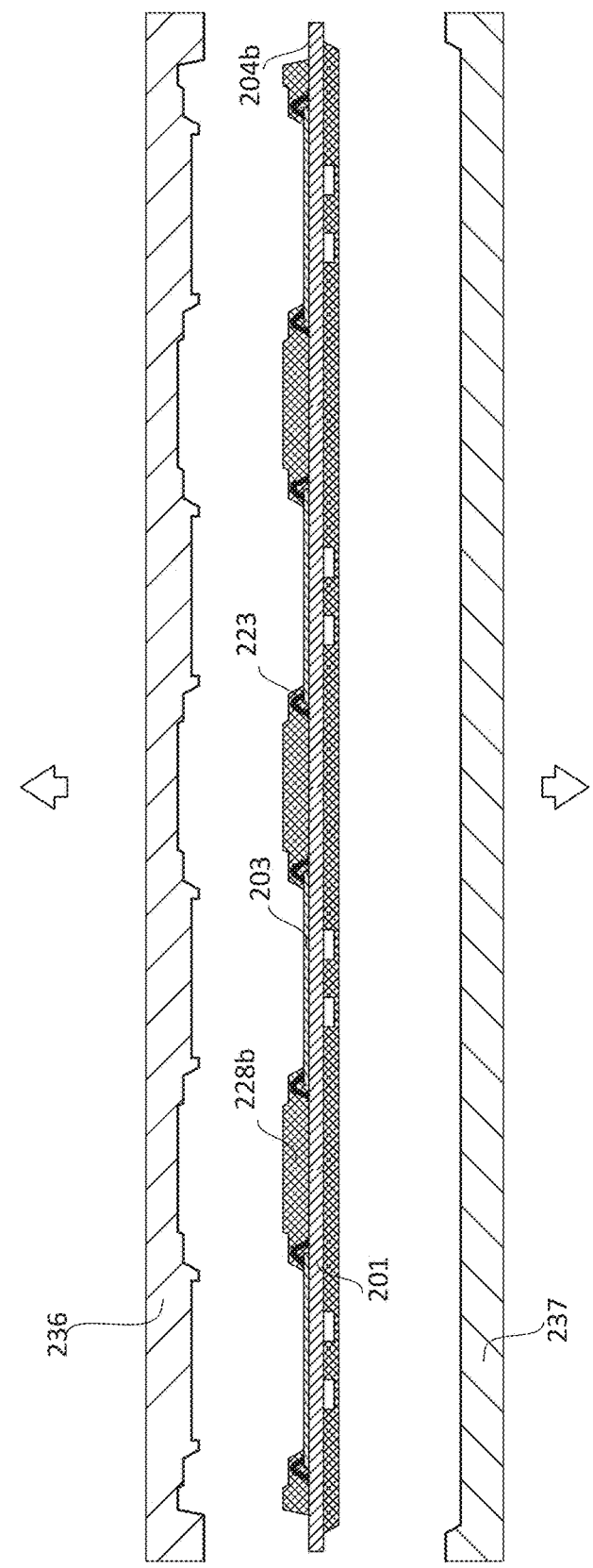
FIG. 2(g)
FIG. 2(h)

MANUFACTURE OF SEMICONDUCTOR MODULE WITH DUAL MOLDING

TECHNICAL FIELD

The disclosure relates generally to systems and methods for preparing semiconductor modules, particularly, semiconductor modules used in image-sensing devices such as cameras in portable devices.

BACKGROUND

Image-sensing devices are widely used in electronic devices. The image-sensing devices need to be configured to fit in the electronic devices, the design of which is often driven by consumer demands. For instance, with portable electronic devices, consumers prefer smaller sizes and are generally not willing to accept any sacrifice with respect to the devices' capabilities and qualities. In particular, in the field of portable electronic devices, such a smartphone and tablets, thinner devices are typically considered more attractive than thicker ones.

As a result of the race to making thin devices, the image-sensing device is often left protruding from the surface of an electronic device. The thinner image-sensing device can also be wider, leaving less room for other components. Therefore, reducing the dimensions of an image-sensing device is of great importance. However, due to the physics of light, alteration of certain aspects of an image-sensing device is restricted.

An image-sensing device generally includes a circuit board, a photosensitive member, electric components, an optical lens or lens assembly, and a holder that mounts the other components on the circuit board.

SUMMARY

One aspect of this disclosure is directed to a method for manufacturing a semiconductor module for an image-sensing device. The method may comprise forming a first molding component on a first surface of a printed circuit board (PCB); mounting at least a photosensitive member to a second surface of the PCB; and forming a second molding component on the second surface of the PCB. The PCB may comprise at least an electric component on the first surface of the PCB. The first molding component may encapsulate the at least one electric component and/or secure the at least one electric component to the PCB. The second molding component may secure the photosensitive member on the PCB. In some embodiments, the mounting causes the photosensitive member to be electrically coupled to the second surface of the PCB.

Another aspect of this disclosure is directed to a method for manufacturing a semiconductor module for an image-sensing device. The method may comprise forming a first molding component on a first surface of a PCB; mounting at least an electric component to a second surface of the PCB; and forming a second molding component on the second surface of the PCB. The PCB may comprise at least a photosensitive member on the first surface of the PCB. The first molding component may secure the photosensitive member with the PCB, and the second molding component may encapsulate the at least one electric component and/or secure the at least one electric component to the PCB.

Another aspect of this disclosure is directed to a method for manufacturing a semiconductor module for an image-sensing device. The method may comprise forming a first molding component on a first surface of a PCB, and a second molding component on a second surface of the PCB at the same time. The first molding component may encapsulate at least an electric component on the first surface of the PCB, and the second molding component may secure at least a photosensitive member on the second surface of the PCB.

Another aspect of this disclosure is directed to an image-sensing device. The device may comprise one or more lenses, at least a PCB, at least one first electric component; at least one photosensitive member; at least one first molding component; and at least one second molding component. The at least one first electric component may be located on a first surface of the PCB; and the at least one photosensitive member may be located on a second surface of the PCB. The first molding component may be formed on the first surface of the PCB and configured to encapsulate the first electric component and/or secure the first electric component to the PCB. The second molding component may be formed on the second surface of the PCB and configured to secure the photosensitive member with the PCB.

It is to be understood that the foregoing general description and the following detailed description are exemplary and explanatory only, and are not restrictive of the invention, as claimed.

BRIEF DESCRIPTION OF THE DRAWINGS

The accompanying drawings, which constitute a part of this disclosure, illustrate several non-limiting embodiments and, together with the description, serve to explain the disclosed principles.

FIGS. 2(a)-(j) are graphical presentations illustrating a detailed process for manufacturing semiconductor modules for image-sensing devices with dual-molding, consistent with exemplary embodiments of the present disclosure.

DETAILED DESCRIPTION OF THE EMBODIMENTS

Figure 1:
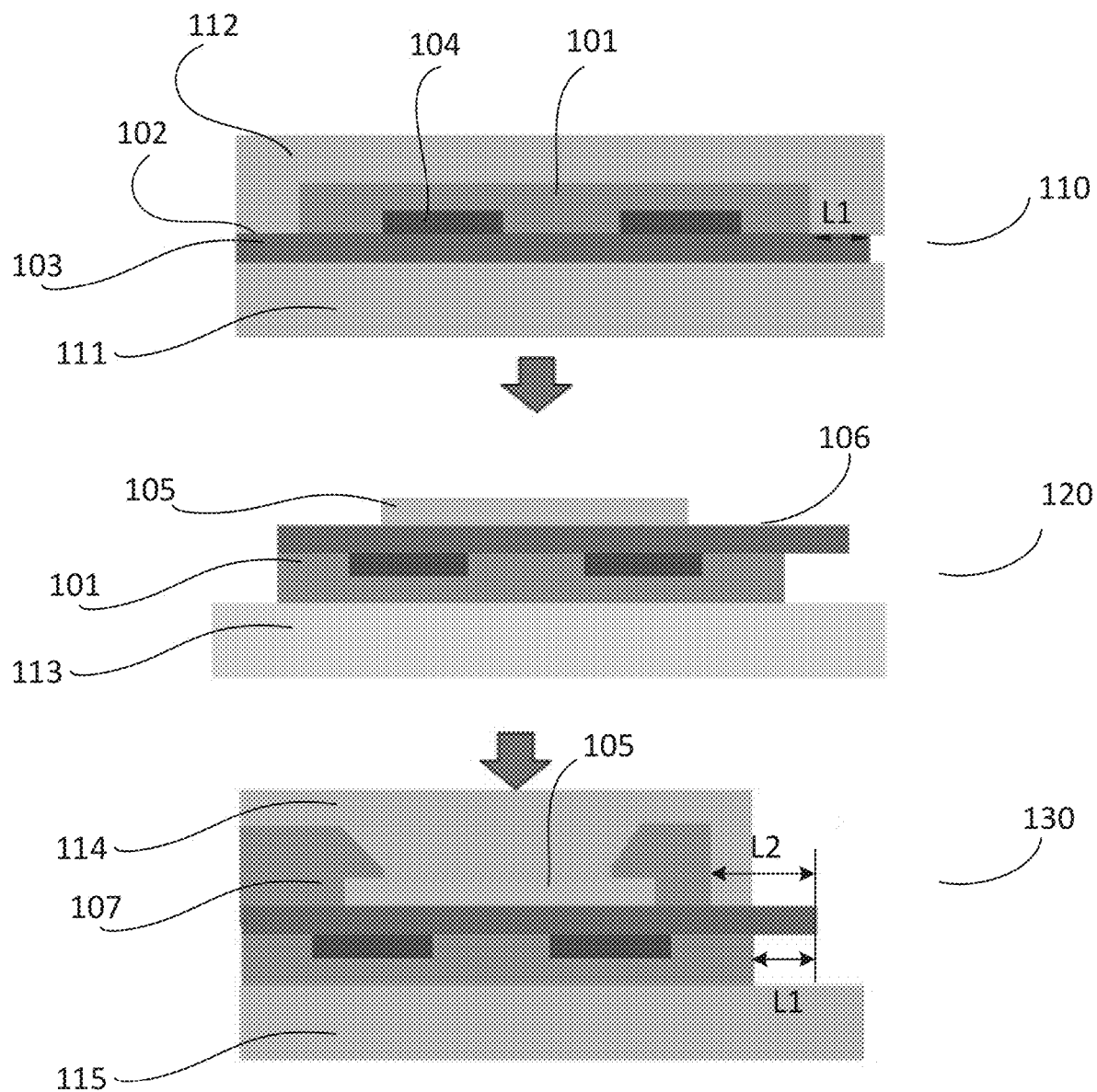
FIG. 1 is a graphical presentation illustrating a method for manufacturing semiconductor modules for image-sensing devices with dual-molding, consistent with exemplary embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention.

Introduction and Definitions

In some common designs of image-sensing devices, the photosensitive member (e.g., image-sensing wafer) is mounted on the circuit board and the electric components are also mounted on the same side of the circuit board. In order to prevent electric shortages and to accommodate all the electric components, the surface of the circuit board needs to be sufficiently large.

It has also been observed that when the electric components and the photosensitive member are located in the same compartment, shedding particles of the electric component due to contact or oxidation may contaminate the photosensitive region of the photosensitive member, or adhere to the filter element, resulting in defective images.

Another observation is that, during the manufacturing process, the photosensitive member is exposed to the air and may collect dust particles, which would compromise the quality of the device. In order to prevent collection of dust, the manufacturing process may need to be carried in a clean room, adding significant costs to the process.

Certain embodiments of the present disclosure provide new image-sensing devices that are smaller in size and more durable than what are currently available on the market, reduce and/or eliminate the presence of dust at least within internal compartments of the devices, and are associated with reduced manufacturing costs. Also provides herein are systems and apparatuses comprising one or more of these novel image-sensing devices, as well as method of making and using said image-sensing devices.

In some embodiments, a process of manufacturing a semiconductor module is provided. In one embodiment, the circuit board is provided that contains or can be prepared/configured to contain electric components required by the semiconductor module. The circuit board, e.g., a printed circuit board (PCB), can have a surface that would face the lens assembly when assembled into an image-sensing device, hereinafter referred to as a "lens-facing surface." The circuit board can also include an opposite surface, hereinafter referred to as a "back surface."

In some embodiments, an electric component is disposed on the back surface of the circuit board. In some embodiments, at least one electric components are disposed on the back surface. In some embodiments, the circuit board contains one "set" of electric components required for an image-sensing device. In some embodiments, the circuit board includes multiple sets, so that when the circuit board is eventually divided into individual units, each unit can be assembled into an image-sensing device. In this context, a portion of the circuit board that includes a requisite set of the electric component is referred to as a "circuit board unit", or "printed circuit board unit" (PCB unit).

In some embodiments, an image-sensing device may include one or more lens assemblies, and/or one or more photosensitive groups. A grouping of a lens assembly and a photosensitive group may be referred to herein as a camera. In some embodiments, an image sensitive device may include at least two of such groupings (cameras) and thus be referred to as having a multi-camera array. In some embodiments, a multi-camera array may include two cameras. In some embodiments, a multi-camera array may include four cameras.

In some embodiments, in addition to the electric components disposed on the back surface of the circuit board, one or more electric components can also be disposed on the lens-facing surface. In some embodiments, there are no electric components on the lens-facing surface. In some embodiments, there are fewer electric components on the lens-facing surface than on the back surface of the circuit board.

A "photosensitive member" as used herein refers to a semiconductor material having a substantively smooth surface which is sensitive to light and can be configured to convert light to electric signals. The surface is commonly flat and the member typically comprises an electric circuit on a wafer which is made of semiconducting materials with methods readily known in the art.

In some embodiments, the photosensitive member is not in direct contact with any of the electric components. In some embodiments, the electric components and welding materials are insulated from the photosensitive member with a non-conductive material, or a molding component. Welding material may refer to materials that are used to connect certain components of the image-sensing device via welding. The welding materials may be used, for example, to connect, and further facilitate electrical connections between electric components/conducting wires of the image sensing devices, as described in detail.

In some embodiments, one or more molding components can be used to secure a photosensitive member to the circuit board. Preferably, the molding components also encapsulate and protect the electric components on the circuit board. In the manufacturing process, in some embodiments, the molding component and a photosensitive member can, at any order, be formed on the lens-facing and back surfaces of the circuit board. In some embodiments, a first molding component is formed on the back surface of the circuit board first, followed by attaching a photosensitive member on the lens-facing surface, and subsequently forming a second molding component on the lens-facing surface. In some embodiments, a first molding component is formed to the lens-facing surface of the circuit board first, followed by mounting the electric components on the back surface, and a second molding component is then formed on the back surface. In some embodiments, a first molding component is formed on the back surface of the circuit board and a second molding component is formed on the lens-facing surface of the circuit board at the same time. As described in further detail later, various materials and methods can be used to form the molding components.

The prepared circuit board can then be separated into individual units, which can be referred to as "semiconductor modules" and can be used to prepare image-sensing devices.

The presently disclosed processes greatly reduce contamination to the photosensitive member or other parts of the device. The disclosed processes reduce direct exposure of the photosensitive surface of the photosensitive member to the environment of the workshop. Such exposure greatly increases the likelihood of damage and contamination. The processes disclosed herein, therefore, result in higher quality image-sensing devices and increase overall process yield.

The processes disclosed herein also result in semiconductor modules and devices having a smaller size than what is typically achieved by conventional manufacturing methods. For instance, rather than placing the electric components on the lens-facing side of the board, the electric components are placed below the board, or placed on both sides of the board, in various embodiments of the present technology.

In a conventional circuit board, all components may be placed on one side of the board, so all conducting lines have to enter the board, make connections between the components, and then return to the same side of the board. With an increasing amount of components, the conducting lines may be arranged in increasingly complex manners, and require a greater level of alignment distances. Moreover, as the number of the components increases, two or more layers of conducting lines may be required within the circuit board. In contrast, placing the electric components on both sides of the board, thus utilizing the back surface of the board and enabling a more compact arrangement of the components to reduce the size of the module. With such a design in which both components are placed on both sides of the board, the alignment distances between the conducting lines can also be reduced. Further, with such a design, a total volume (including the thickness of the conducting lines) occupied by the conducting lines is much smaller.

The semiconductor modules and devices made by the processes disclosed herein are also be more durable than what are made by the conventional methods. In conventional manufacturing methods, module components may be fixed on the circuit board by soldering or resin. However, for semiconductor modules or devices made by such conventional manufacturing methods, external vibrations may loosen the components thereof or even cause them to fall off. Conversely, in the processes disclosed herein, one or more molding components are employed to secure various components in the board to ensure reliability and durability of the whole module or device. In some embodiments, instead of using a separate frame, a molding component may be used in an image-sensing device that includes a plurality of semiconductor modules. Each semiconductor module may be arranged to provide an array of modules each having a lens assembly and associated photosensitive members and circuit boards. The molding components may secure the lens assemblies, photosensitive members and module components, and enhance the structure stability of the image-sensing device.

EXEMPLARY EMBODIMENTS

FIG. 1 is a graphical presentation illustrating a method 100 for manufacturing semiconductor modules for image-sensing devices with dual-molding, in accordance with one exemplary embodiment of the present disclosure. The method 100 may be implemented in conjunction with any of the features/components described herein, such as those described with reference to other embodiments and FIGS. The method 100 may also be used for various applications and/or according to various permutations, which may or may not be noted in the illustrative embodiments/aspects described herein. For instance, the method 100 may include more or less operations/steps than those shown in FIG. 1, in some embodiments. Moreover, the method 100 is not limited by the order of operations/steps shown therein.

At step 110 in FIG. 1, a first molding component 101 is formed on a first surface 102 of a PCB 103 (an example of a circuit board) with a first pair of molding tools 111 and 112. The molding tools 111 and 112 may be configured to include a hollow space that is filled with a molding material. The molding material may harden or set inside the molding tools, adopting the molding tools' shape and forming the first molding component 101. In some embodiments, the first surface 102 is the back surface of the PCB 103. The PCB 103 may include one or more electric components 104. The electric components 104 may be located on the back surface of the PCB 103, and the first molding component 101 may secure the electric components 104 to the PCB 103. In some embodiments, the first molding component 101 may encapsulate the electric components 104, and prevent exposure of the electric components 104 to the external environment. In some embodiments, the first molding component 101 may cover one or more portions of the back surface of the PCB 103. In some embodiments, the first molding component 101 may not fully cover an entirety of the back surface of the PCB 103.

The back surface of the PCB may include a first exposed area L1, e.g., an area where the molding component 101 is absent. In some embodiments, the first exposed area L1 may have the following dimensions: $0.1\ mm \leq L1 \leq 10\ mm$. In some embodiments, the first exposed area L1 may be the area in which one or more portions of the molding tool 112 are positioned/placed. In some embodiments, the first exposed area L1 may be configured to balance pressures applied by the molding tools 111, 112.

At step 120 in FIG. 1, a photosensitive member 105 (e.g., a chip) may be placed on a second surface 106 of the PCB 101. In some embodiments, the second surface 106 of the PCB 103 is the lens-facing surface of the PCB 103. Before placing the photosensitive member 105, the first pair of molding tools 111 and 112 may be removed, and the PCB 103 may be flipped with the lens-facing surface of the PCB 103 facing upwards (e.g., towards the top of the drawing paper/sheet of FIG. 1), then the PCB 103 may be placed on a diode attaching (DA) machine 113 with the first molding component 101 contacting with the DA machine 113.

At step 130 in FIG. 1, a second molding component 107 is formed on the lens-facing surface of the PCB 103 with a second pair of molding tools 114 and 115. The second molding component 107 may secure the photosensitive member 105 on the lens-facing surface of the PCB 103. In some embodiments, the second molding component 107 may have an opening, which allows the photosensitive member 105 to receive light. In some embodiments, the second molding component 107 may cover one or more portions of the lens-facing surface of the PCB 103. In some embodiments, the second molding component 107 may not cover an entirety of the lens-facing surface of the PCB 103.

The lens-facing surface of the PCB may include a second exposed area L2, e.g., an area where the second molding component 107 is absent. In some embodiments, the second exposed area L2 may have the following dimensions: $0.1\ mm \leq L2 \leq 10\ mm$. In some embodiments, one or more portions of the first exposed area L1 may overlap one or more portions of the second exposed area L2. In some embodiments, L2 is about equal to or greater than L1. In some embodiments, the first exposed area L1 and the second exposed area L2 do not overlap entirely. In some embodiments, the second exposed area L2 may be the area in which one or more portions of the molding tool 114 is positioned/placed. In some embodiments, the second exposed area L2 may be configured to balance pressures applied by the molding tools 114, 115.

FIGS. 2(a)-(j) present a detailed process 200 for manufacturing semiconductor modules for image-sensing devices with dual-molding, in accordance with one exemplary embodiment of the present disclosure. The process 200 may be implemented in conjunction with any of the features/components described herein, such as those described with reference to other embodiments and FIGS. The process 200 may also be used for various applications and/or according to various permutations, which may or may not be noted in the illustrative embodiments/aspects described herein. For instance, the process 200 may include more or less operations/steps than those shown in FIGS. 2(a)-(j), in some embodiments. Moreover, the process 200 is not limited by the order of operations/steps shown therein.

Figure 2A:
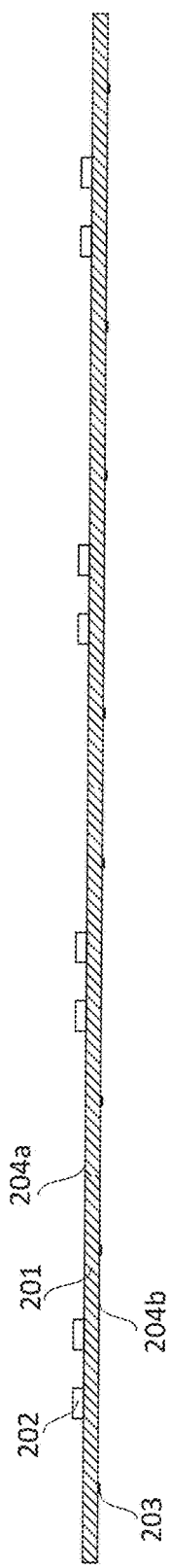

As shown in FIG. 2(a), a PCB 201 may have a first surface 204a and a second surface 204b. One or more electric components 202 are placed on the first surface 204a of the PCB 201. A plurality of welding materials 203 may be located on the second surface 204b of the PCB 201. The welding materials may be configured to couple a photosensitive member (not shown in FIG. 2(a)) to the PCB 201.

In some embodiments, the first surface of the PCB 201 may be the back surface, and the second surface of the PCB 201 may be the lens-facing surface. In some embodiments, the first surface of the PCB 201 may be the lens-facing surface, and the second surface of the PCB 201 may be the back surface.

In some embodiments, the PCB 201 may include a plurality of PCB units, and each of the PCB units may include one or more electric components and one or more welding materials.

Figure 2B:
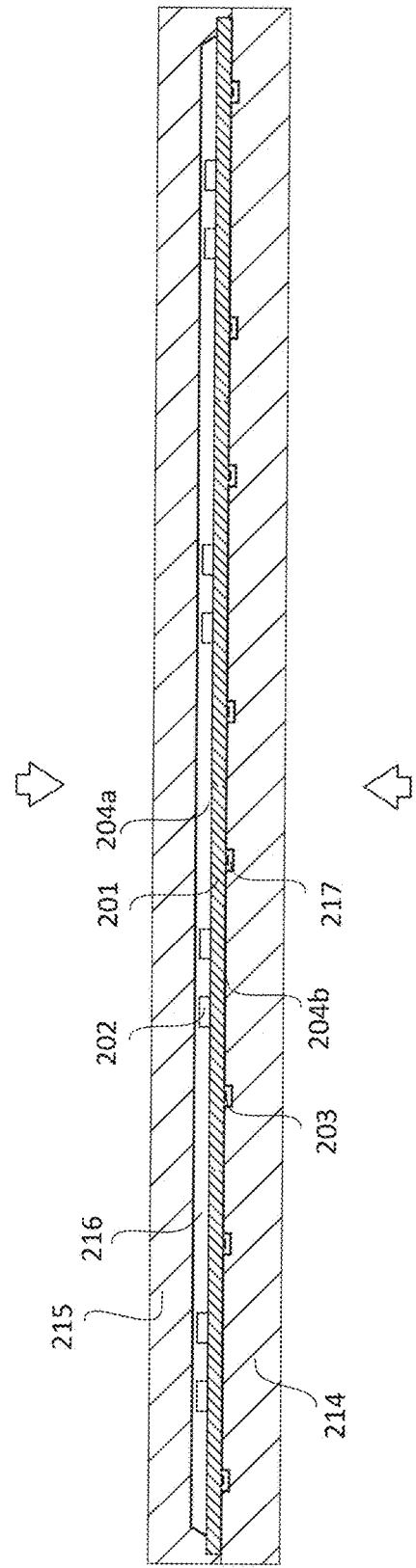

In FIG. 2(b), a pair of molding tools 214 and 215 are applied to the second surface and the first surface, respectively, of the PCB 201. The molding tools 214, 215 may cover an entirety of the second and first surfaces (204b and 204a), respectively, of the PCB 201. The molding tool 214 may be configured to support the PCB 201 on the second surface 204b of the PCB 201, and have a plurality of gaps 217 to protect the welding materials 203 from deformation. The molding tool 215 may cover the first surface 204a of the PCB 201, enclosing the electric components 202 within a space 216.

Figure 2C:
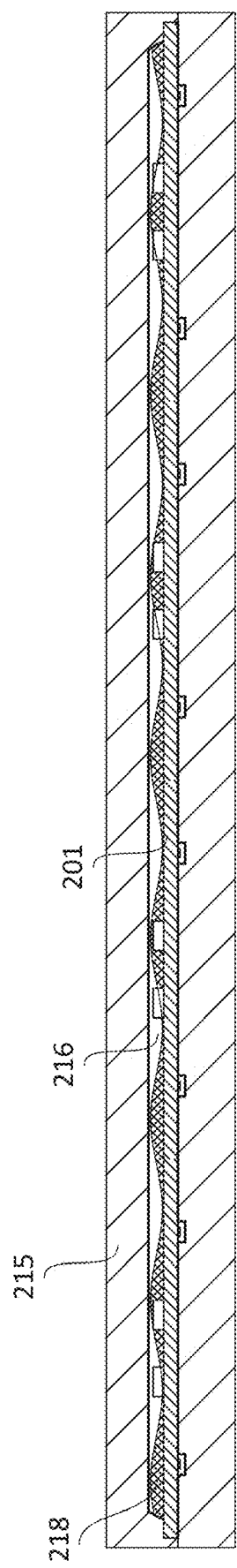
Figure 2D:
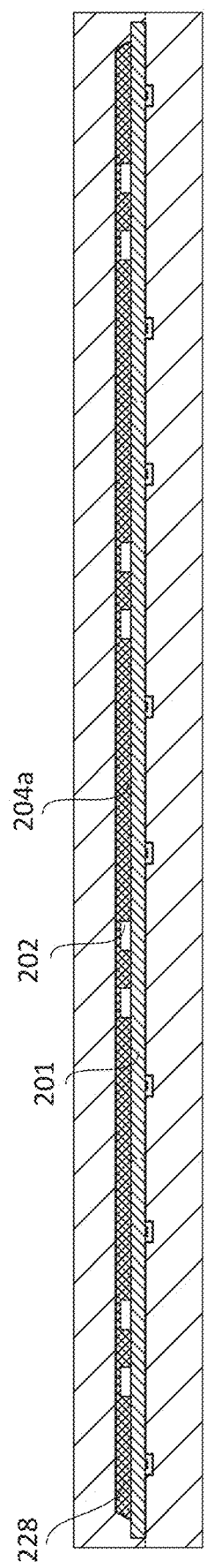

In FIG. 2(c), a molding material 218 may be placed into the space 216 formed by the molding tool 215 and PCB 201. This molding material 218 may form a first molding component 228 on the first surface 204a of the PCB 201, as shown in FIG. 2(d). The first molding component 228 may secure the electric components 202. In some embodiments, the first molding component 228 may encapsulate the electric components 202, and prevent exposures of the electric components 202 to the external environment.

In some embodiments, the first molding component 228 may be formed by a technique including, but not limited to, blow molding, powder metallurgy and sintering, compression molding, injection molding, extrusion molding, laminating, reaction injection molding, matrix molding, rotational molding, spin casting, transfer molding, thermoforming, vacuum forming, etc.

In some embodiments, the first molding component 228 may comprise one or more polymers (e.g., epoxy resin). For example, an epoxy molding compound (EMC) may be used as the molding material. In some embodiments, EMCs are solid epoxy polymers that are heated to a liquid and then injected into a molding device to form protection. EMCs may be an advantageous material with which to encapsulate semiconductor devices due to their superior properties such as high mechanical strength and high productivity.

In some embodiments, the first molding component 228 may comprise polyvinyl butyral, a silicon, a ceramic, a transparent material, graphite, or combinations thereof.

In some embodiments, the first molding component 228 may be formed by a mix reaction, heating, or exposure to UV light.

Figure 2E:
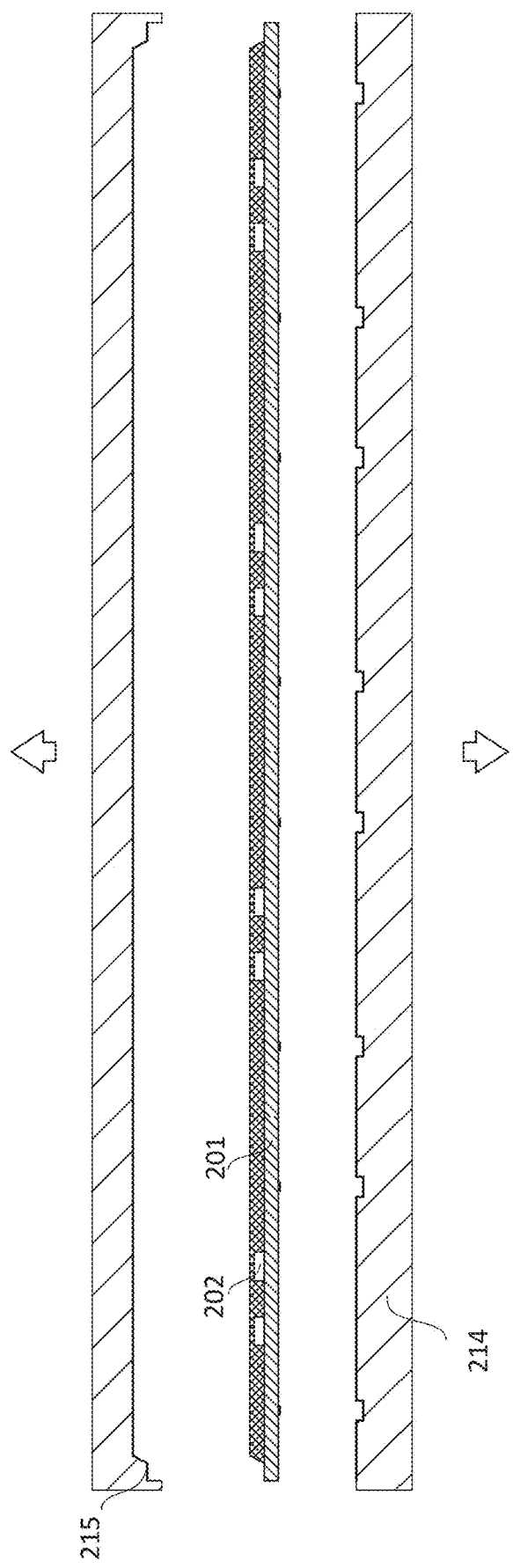
Figure 2F:
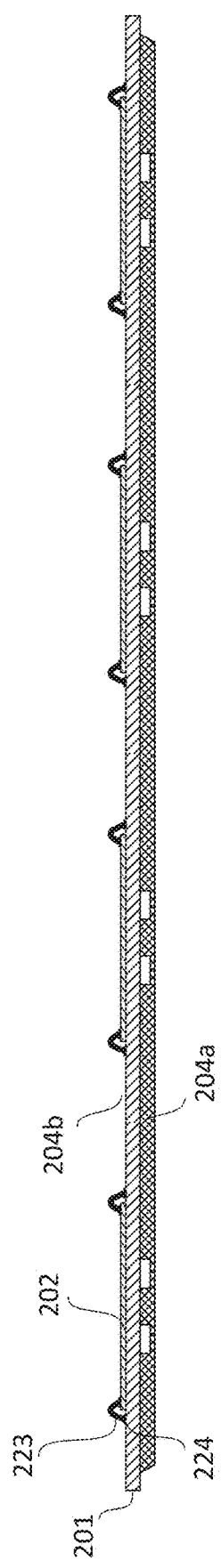

In FIG. 2(e), the molding tools 214 and 215 have been removed. In FIG. 2(f), the PCB 201 may be flipped with the first surface 204a facing downwards and the second surface 204b facing upwards. One or more photosensitive members 202 may be attached to the second surface 204b of the PCB 201. A plurality of conducting wires 223 may electrically connect the photosensitive members 202 and the PCB 201 through the welding materials 224. In some embodiments, prior to mounting the photosensitive members 202 to the PCB 201, photosensitive members 202 may be cleaned.

In FIG. 2(g), a second pair of molding tools 236 and 237 may be placed on the PCB 201. The molding tool 237 may be configured to cover and support the first molding component 228. The molding tool 236 may cover the second surface 204b of the PCB 201. The molding tool 236 may include a plurality of pressure applying points 230, which may be placed and configured to apply pressure to the photosensitive members 203. The molding tool 236 may create a plurality of spaces 238 and 239 with the PCB 201. The conducting wires 223 may be included inside the spaces 238, and the spaces 238 may be filled with molding materials 218b. The spaces 239 may enclose the photosensitive members 203 and prevent the photosensitive members 204 from contacting with the molding materials.

In FIG. 2(h), a second molding component 228b may be formed from the molding materials (218b) on the second surface 204b of the PCB 201, and the pair of the molding tools 236 and 237 may be removed. The second molding component 228b may secure the photosensitive member 203 on the second surface 204b of the PCB 201, and encapsulate the conducting wires 223. In some embodiments, the second molding component 228b may have an opening, which allows the photosensitive member 203 to receive light.

In some embodiments, the second molding component 228b may also be formed by a technique including, but not limited to, blow molding, powder metallurgy and sintering, compression molding, injection molding, extrusion molding, laminating, reaction injection molding, matrix molding, rotational molding, spin casting, transfer molding, thermoforming, vacuum forming, etc.

In some embodiments, the second molding component 228b may comprise one or more polymers. For example, an epoxy molding compound (EMC), as described above, may be used as the molding material.

In some embodiments, the second molding component 228b may comprise polyvinyl butyral, a silicon, ceramics, a transparent material, or graphite.

In some embodiments, the first and second molding components 228, 228b may be comprised of the same material. In some embodiments, the first and second molding components 228, 228b may be comprised of different materials.

In some embodiments, the second molding component 228b may be formed by a mix reaction, heating, or exposure to UV light.

Figure 2I:
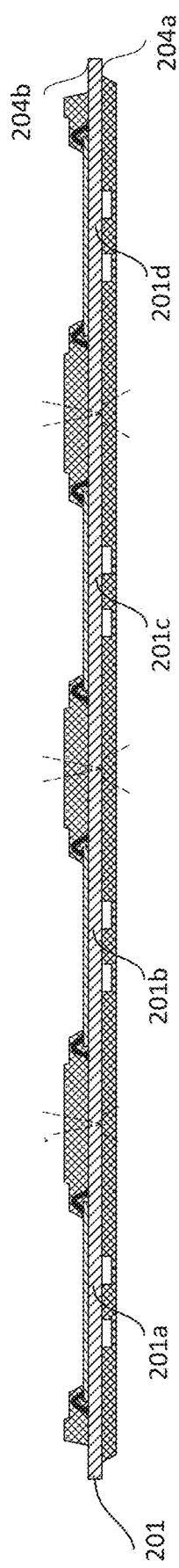

In some embodiments, the PCB 201 may include multiple PCB units (201a, 201b, 201c, and 201d), so that the PCB 201 can be eventually divided (at., e.g., the areas located by "x") into individual units 201a, 201b, 201c, and 201d. As shown in FIG. 2(i), each PCB unit can be assembled into a lens assembly to form an image-sensing device. In one embodiment, the PCB is flipped before the PCB is divided into individual PCB units, such that lens-facing surface 204b is facing upwards (e.g., towards the top of the drawing paper/sheet of FIG. 2(i)). In another embodiment, the PCB is first divided into individual PCB units, then each PCB unit is flipped to have the lens-facing surface 204b of the PCB facing upwards.

Figure 2J:
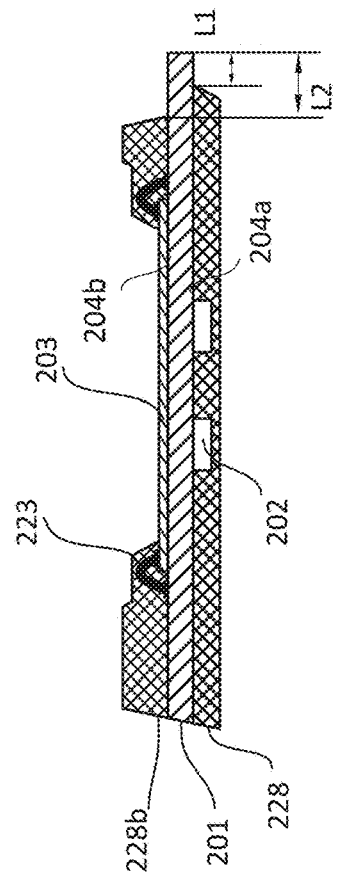

FIG. 2(j) is a graphical representation illustrating an exemplary semiconductor module of the present disclosure that can be used in an image-sensing device, consistent with exemplary embodiments of the present disclosure. The module may comprise a number of components, some of which may be optional. In some embodiments, the module may include many more components than those shown in FIG. 2(j). However, it is not necessary that all of these components be shown in order to disclose an illustrative embodiment.

The module may include a PCB 201, one or more electric components 202, at least a photosensitive member 203, one or more conducting wires 223, a first molding component 228 and a second molding component 228b. The PCB 201 may have a first surface 204a and a second surface 204b. In some embodiments, the first surface 204a of the PCB 201 may be the back surface, and the second surface 204b of the PCB 201 may be the lens-facing surface. In some embodiments, the first surface 204a of the PCB 201 may be the lens-facing surface, and the second surface 204b of the PCB 291 may be the back surface. The electric components 202 and the first molding component 228 may be located on the first surface 204a of the PCB 201, and the first molding component 228 may secure and encapsulate the electric components 202. The photosensitive member 203, conducting wires 223 and the second molding component 228b may be located on the second surface 204b of the PCB 201. The second molding component 228b may secure the photosensitive member 203 to the second surface 204b of the PCB 201, and encapsulate the conducting wires 223. In some embodiments, the second molding component 228b may have an opening, which allows the photosensitive member 203 to receive light. In some embodiments, the second molding component 228b may cover the photosensitive member 203, and at least a portion of the second molding component 228b is transparent to allow at least 80% of incident light to pass through the second molding component 228b to reach the photosensitive member 203. In some embodiments, at least a portion of the second molding component 228b is transparent to allow at least 80%, at least 85%, at least 90%, at least 95%, or at least 98% of the incident light to pass through the second molding component 228b to reach the photosensitive member 203. In some embodiments, at least a portion of the second molding component 228b is transparent to allow about 100% of the incident light to pass through the second molding component 228b to reach the photosensitive member 203.

In some embodiments, the first molding component 228 may not fully cover the first surface 204a of the PCB 201. The first surface 204a of the PCB 201 may therefore include a first exposed area L1. In some embodiments, the first exposed area L1 may have the following dimensions: 0.1 mm≤L1≤10 mm. In some embodiments, the first exposed area L1 may be the area in which one or more portions of a first molding tool, as described herein, is positioned/placed. In some embodiments, the first exposed area L1 may be configured to balance pressures applied by the first molding tool and a second molding tool positioned on the second surface 204b of the PCB 201.

In some embodiments, the second molding component 228b may not fully cover the second surface 204b of the PCB 201. The second surface 204b of the PCB 201 may include a second exposed area L2. In some embodiments, the second exposed area L2 may have the following dimensions: 0.1 mm≤L2≤10 mm. In some embodiments, one or more portions of the first exposed area L1 may overlap one or more portions of the second exposed area. In some embodiments, the first exposed area L1 and the second exposed area L2 do not overlap entirely. In some embodiments, the second exposed area L2 may be the area in which the second molding tool, referenced directly above, is positioned/placed In some embodiments, the second exposed area L2 may be configured to balance pressures applied by the first and second molding tools.

Figure 3A:
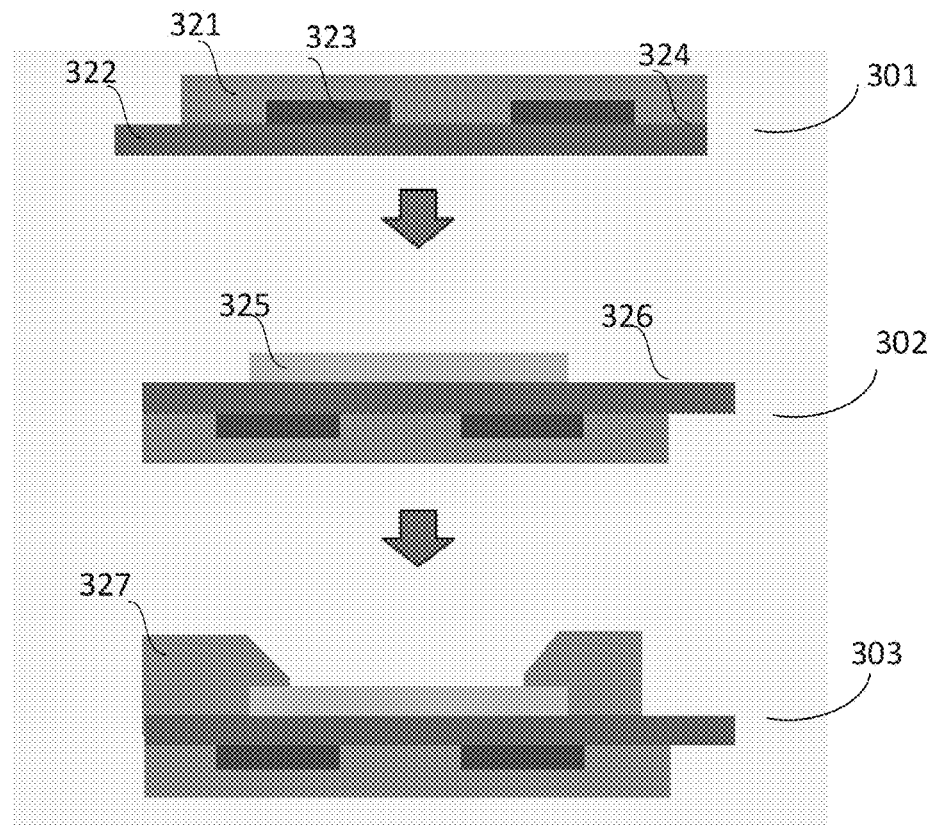
FIGS. 3(a)-(b) are graphical presentations illustrating two implementation processes of the dual-molding method for manufacturing semiconductor modules, consistent with exemplary embodiments of the present disclosure.
Figure 3B:
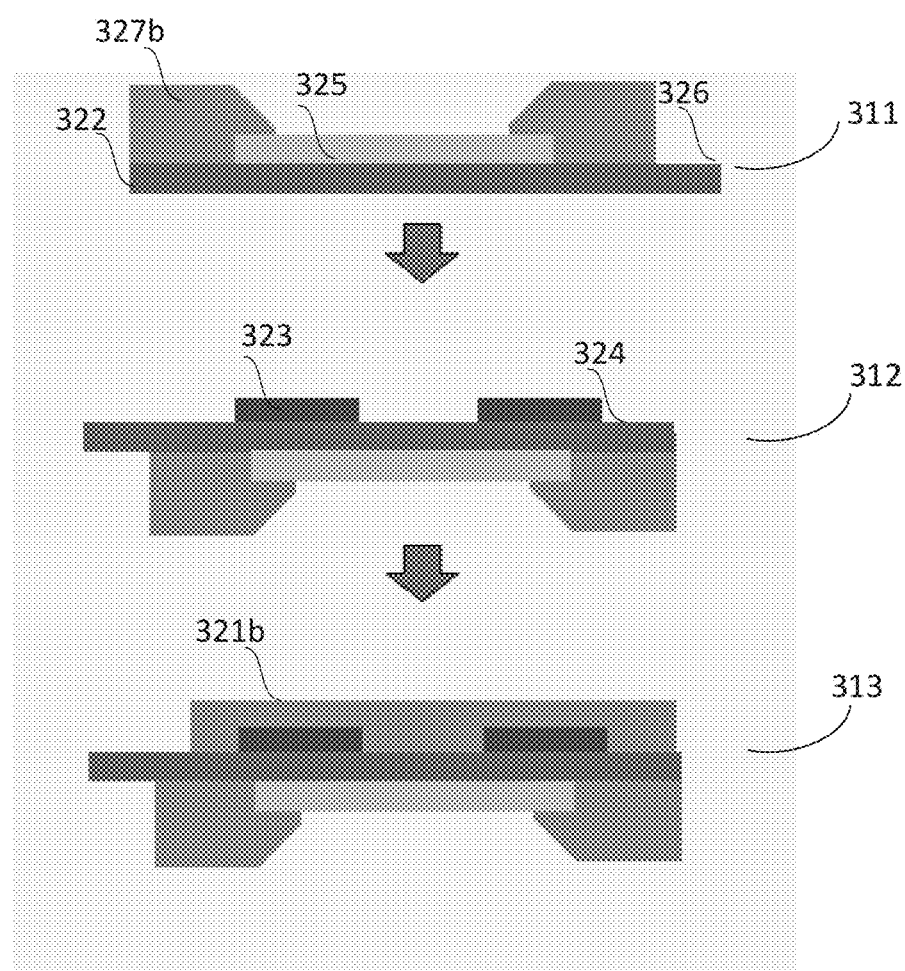

FIGS. 3(a)-(b) present two implementation processes 300 and 310, respectively, of the dual-molding method for manufacturing semiconductor modules, in accordance with exemplary embodiments of the present disclosure.

In the process 300 shown in FIG. 3(a), a first molding component 321 is formed on the back surface 324 of a PCB 322 at step 301. One or more electric components 323 may be located on the back surface 324 of the PCB 322, and the first molding component 321 secures the electric components 323 to the PCB 322. At step 302, the PCB 322 is flipped with the lens-facing surface 326 facing upward, and a photosensitive member 325 is attached on the lens-facing surface 326 of the PCB 322. At step 303, a second molding component 327 is formed on the lens-facing surface 326 of the PCB 322 and secures the photosensitive member 325.

In the process 310 shown in FIG. 3(b), a first molding component 327b is formed on the lens-facing surface 326 of a PCB 322 at step 311. A photosensitive member 325 may be located on the lens-facing surface 326 of the PCB 322, and the first molding component 327b secures the photosensitive member 325. At step 312, the PCB 322 is flipped with the back surface 324 facing upward, and one or more electric components 323 are mounted on the back surface 324 of the PCB 322. At step 313, a second molding component 321b is formed on the back surface 324 of the PCB 322 and secures the electric components 323 to the PCB 322.

In process 300, the photosensitive member 325 is attached after the electric components 323 are mounted on the PCB 322, which reduces the photosensitive member's exposure to the external environment, and chances of contamination.

In process 310, mounting the electric components 323 to the PCB 322 requires a surface mounting technique which may include high temperature soldering. This mounting process may be associated with high likelihoods of damage and contamination. Therefore, process 300, may result in higher quality image-sensing devices and increases overall process yield.

Figure 4A:
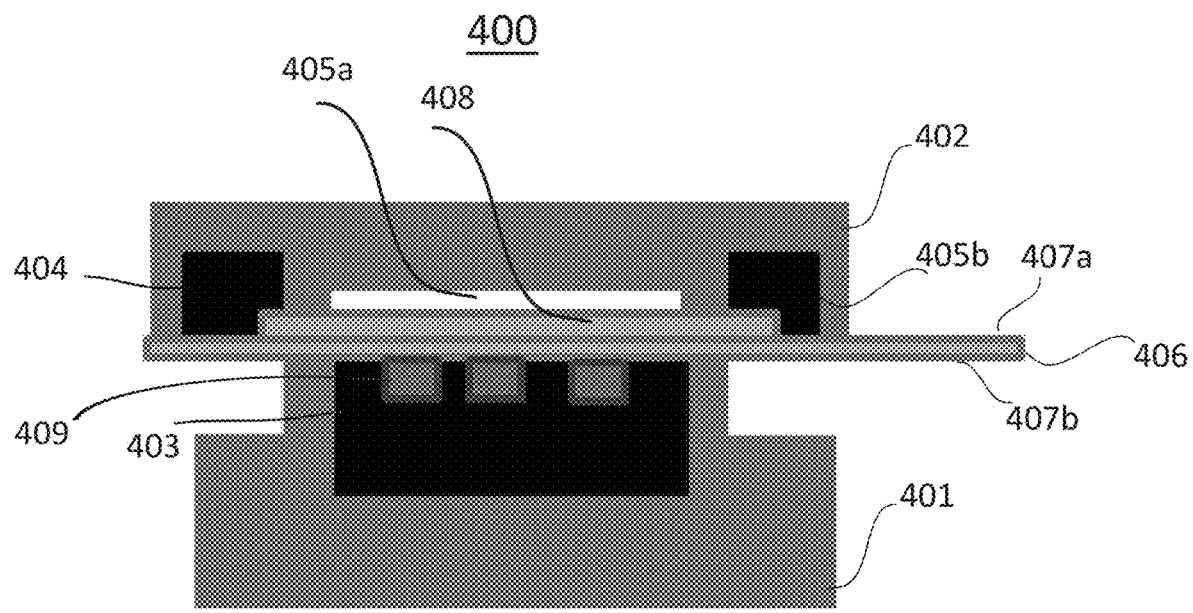
FIGS. 4(a)-(b) are graphical presentations illustrating different embodiments of the dual-molding method for manufacturing semiconductor modules, consistent with exemplary embodiments of the present disclosure.
Figure 4B:
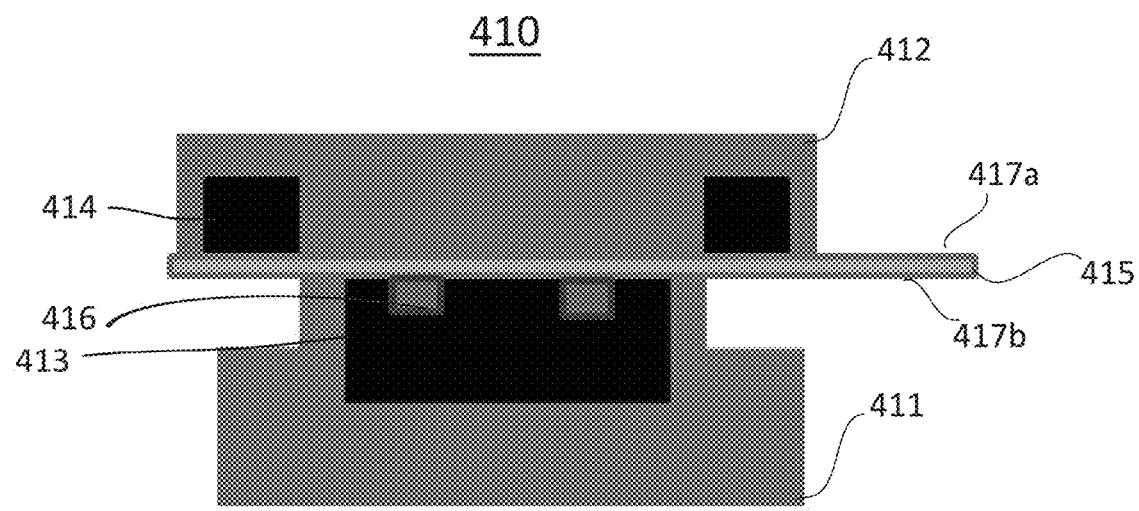

FIGS. 4(a)-(b) present different embodiments of the dual-molding methods 400, 401, respectively, for manufacturing semiconductor modules. In these methods 400, 401, first and second molding components 403, 404 may be not formed in two successive steps, but rather formed simultaneously with different pairs of molding tools. For instance, as shown in FIG. 4(a), a pair of molding tools 401 and 402 may be applied to a PCB 406 at the same time, and form the first molding component 403 on the back surface 407b of the PCB 406 and a second molding component 404 on the lens-facing surface 407a of the PCB 406. The PCB 406 may include one or more electric components 409 on the back surface and a photosensitive member 408 on the lens-facing surface. The molding tool 402 may create an enclosed space 405a above the photosensitive member 408 to prevent damage to the photosensitive member 408 by pressure or contamination.

FIG. 4(b) shows a different pair of molding tools 411 and 412. The molding tools 411 and 412 may be applied to a PCB 415 at the same time, and form a first molding component 413 on the back surface 417b of the PCB 415 and a second molding component 414 on the lens-facing surface 417a of the PCB 415. The PCB 415 may include one or more electric components 416 on the back surface.

Figure 5A:
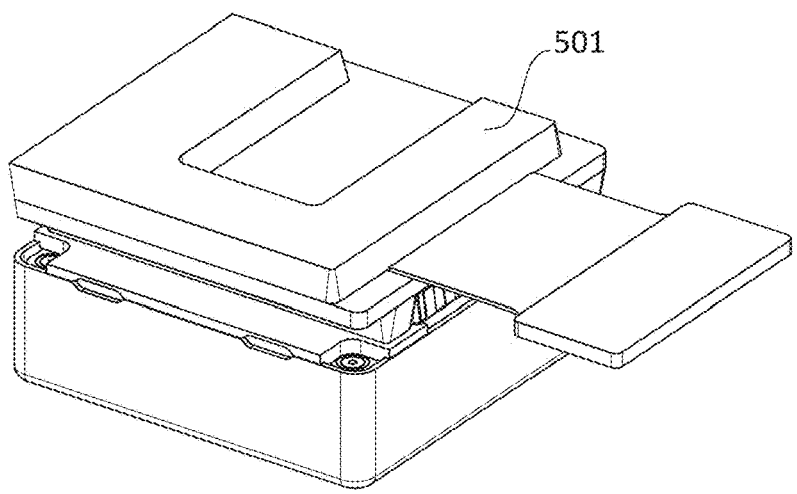
FIGS. 5(a)-(c) are graphical presentations illustrating different embodiments of molding components in a semiconductor module, consistent with exemplary embodiments of the present disclosure.
Figure 5B:
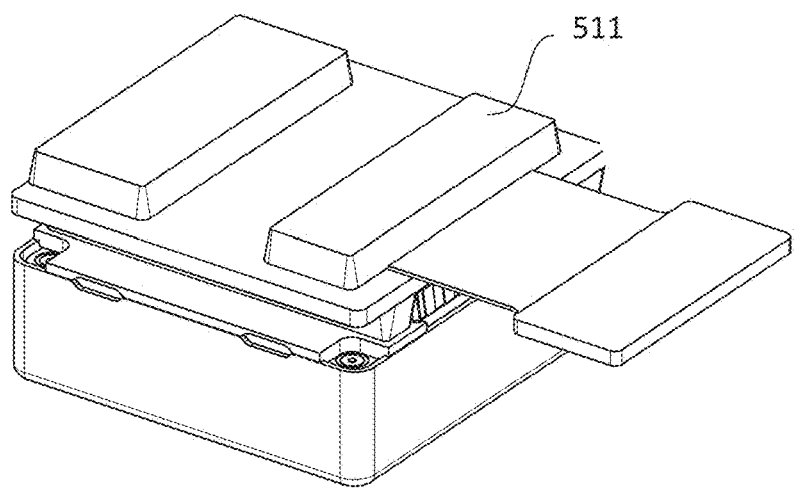
Figure 5C:
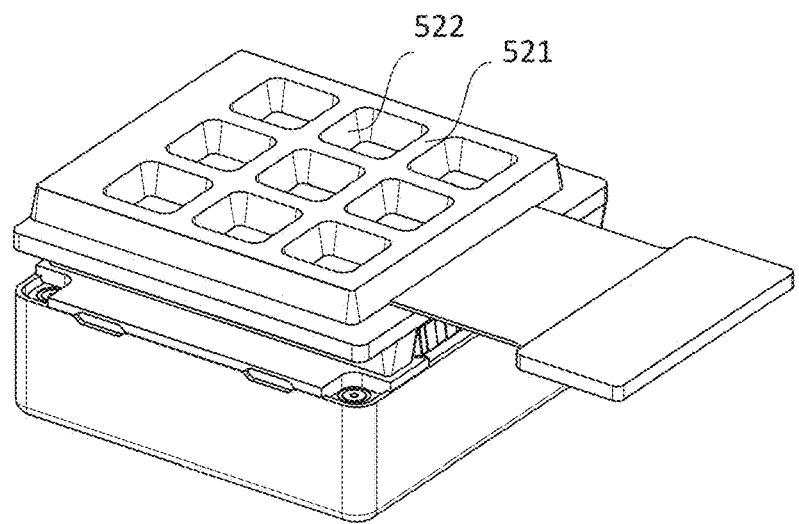

For each pair of molding tools, the two molding tools may apply pressures to a same position on the back surface and the lens-facing surface of the PCB respectively. The molding tools may provide a balanced and consistent pressure while forming an enclosed space on the respective sides of the PCB to contain the molding materials added thereto. As long as the molding components 403, 404 (413, 414) can secure the photosensitive member and encapsulate the electric components as desired, the molding components 403, 404 (413, 414) may each independently have any suitable shape or structure. FIGS. 5(a)-(b) show an exemplary embodiment in which a molding component 501, 511, respectively, may have, for example, a C-shape (501 shown in FIG. 5(a)), and parallel lines (511 shown in FIG. 5(b)). Other suitable shapes may include, but are not limited to a rectangular shape, a circular shape, an elliptical shape, or an irregular shape. FIG. 5(c) shows a molding component 521 having a structure of a grid with multiple holes 522 or protrusions (not shown in the figure). The holes may work as cooling windows. The grid structure may provide an even support to the PCB (not shown in the figure) to increase assembly strength, and spaces for accommodating different assembly structures.

Figure 6A:
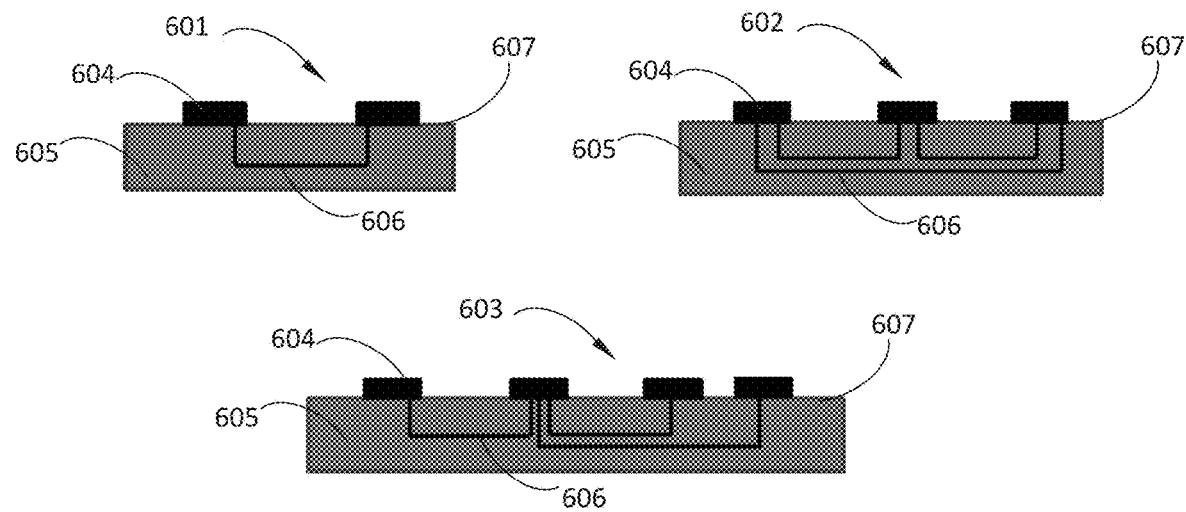
FIGS. 6(a)-(b) are graphical presentations illustrating different embodiments of semiconductor modules, consistent with exemplary embodiments of the present disclosure.
Figure 6B:
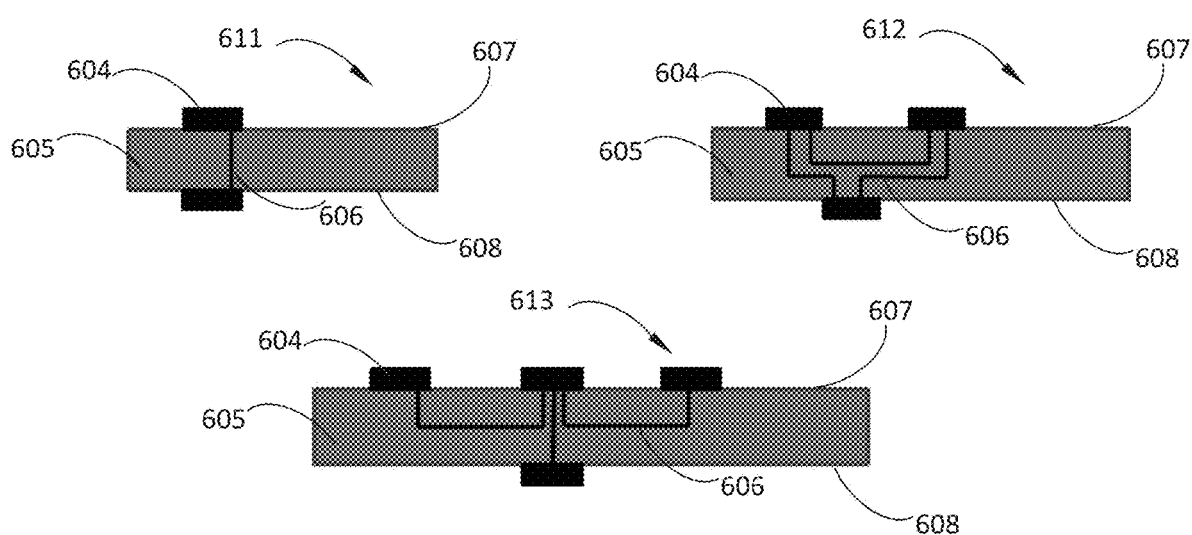

FIGS. 6(a)-(b) present different embodiments of semiconductor modules, in accordance with one exemplary embodiment of the present disclosure. In FIG. 6(a), all components 604 (including photosensitive members and electric components) may locate on a same surface 607 of a PCB 605. Semiconductor modules 601, 602 and 603 include for example, 2, 3 and 4 components 604 on the same side (surface) 607 of the PCBs 605 respectively. Therefore, all conducting lines 606 have to enter the PCBs 605, make connections between the components 604, and then return to the same side of the PCBs 605. As the number of components 604 increases, the conducting lines 606 may be arranged in a more and more complex manner, taking up a greater level of alignment distances. Eventually as the number of the components 604 increases, two or more layers of conducting lines 606 may be required to form within the circuit board 605, as shown in 602 and 603.

In FIG. 6(b), the components 604 may be placed on both sides (surfaces) 607 and 608 of the PCBs 605 as shown in 611, 612 and 613. The back surface 608 of the board can be utilized, and the components 604 can be arranged more compactly to reduce the size of the module. In addition, the alignment distances between the conducting lines 606 can also be reduced. A total volume (including conducting lines' thickness) occupied by the conducting lines 606 in a design of components 604 on both sides is much smaller.

Figure 7A:
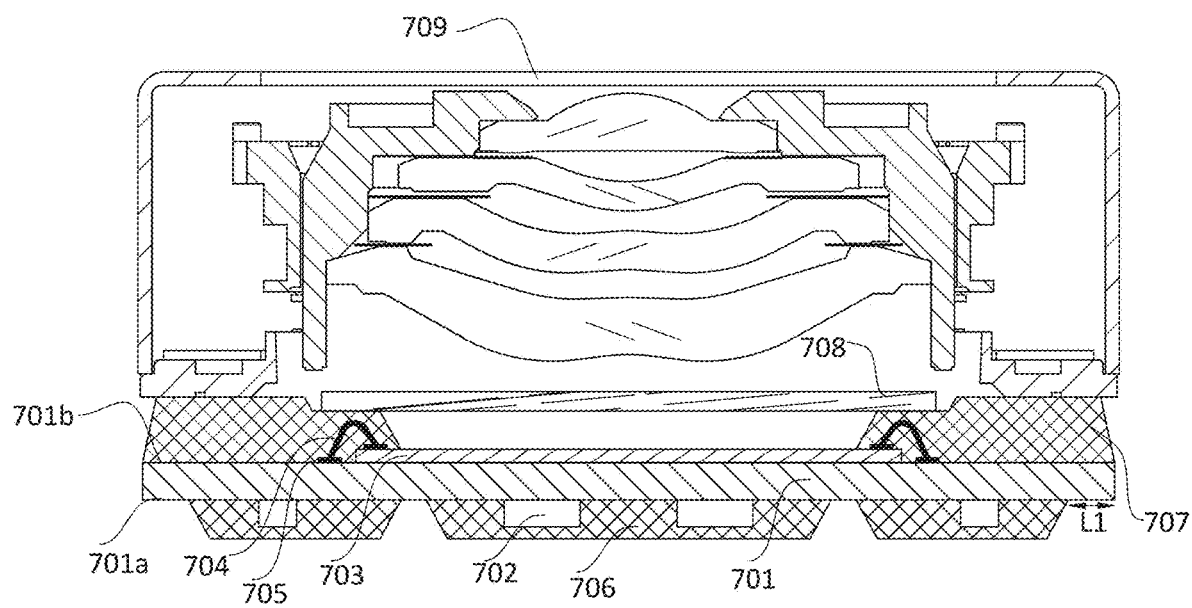
FIGS. 7(a)-(c) are graphical presentations illustrating different embodiments of image-sensing devices, consistent with exemplary embodiments of the present disclosure.

FIG. 7(a) presents an exemplary embodiment of an image-sensing device. As shown in FIG. 7(a), the device 700 may include one or more lens 709, at least a PCB 701, one or more electric component 702, at least a photosensitive member 703, a plurality of conducting wires 704, welding materials 705, a first molding component 706 and a second molding component 707. The conducting wires 704 configured to connect the photosensitive member 703 and welding materials 705. The welding materials 705 are configured to electrically connect the photosensitive member 703 and the PCB 701. In some embodiments, the device 700 may further include a filter 708.

The PCB 701 may have a first surface 701a and a second surface 701b. In some embodiments, the first surface 701a of the PCB 701 may be the back surface, and the second surface 701b of the PCB 701 may be the lens-facing surface.

In some embodiments, the first surface 701a of the PCB 701 may be the lens-facing surface, and the second surface 701b of the PCB 701 may be the back surface. The electric components 702 and the first molding component 706 may locate on the first surface 701a of the PCB 701, and the first molding component 706 may secure and encapsulate the electric components 702. The photosensitive member 703, conducting wires 704, welding materials 705 and the second molding component 707 may locate on the second surface 701b of the PCB 701. The second molding component 707 may secure the photosensitive member 703 on the second surface 701b of the PCB 701, and encapsulate the conducting wires 704. In some embodiments, the second molding component 707 may have an opening, which allows the photosensitive member 703 to receive light. In some embodiments, the second molding component 707 may cover the protonmotive member 703, and at least a portion of the second molding component 707 is transparent to allow at least 80%, at least 85%, at least 90%, at least 95%, or at least 98% of the incident light to pass through the second molding component 707 to reach the photosensitive member 703. In some embodiments, at least a portion of the second molding component 707 is transparent to allow about 100% of the incident light to pass through the second molding component 707 to reach the photosensitive member 703.

In some embodiments, the first molding component 706 may not fully cover all exposed first surface of the PCB 701. The first surface 701a of the PCB 701 may include a first exposed area L1, and 0.1 mm≤L1≤10 mm. In some embodiments, the first exposed area L1 may be configured to place the molding tools; in some embodiments, the first exposed area L1 may be configured to balance pressures applied by the molding tools.

In some embodiments, the second molding component 707 may not fully cover all exposed second surface of the PCB 701. The second surface 701b of the PCB 701 may include a second exposed area L2 (not shown in the figure), and 0.1 mm≤L2≤10 mm. In some embodiments, the first exposed area L1 and the second exposed area L2 do not overlap entirely. In some embodiments, L2 is about equal to or greater than L1. In some embodiments, the second exposed area L2 may be configured to place the molding tools; in some embodiments, the second exposed area L2 may be configured to balance pressures applied by the molding tools.

In some embodiments, the molding components may also be formed by a technique including, but not limited to, blow molding, powder metallurgy and sintering, compression molding, injection molding, extrusion molding, laminating, reaction injection molding, matrix molding, rotational molding, spin casting, transfer molding, thermoforming, vacuum forming, etc.

In some embodiments, the molding components may one or more polymers. For example, an epoxy molding compound (EMC), as described above, may be used as the molding material.

In some embodiments, the molding components may comprise polyvinyl butyral, a silicon, ceramics, a transparent material or graphite.

In some embodiments the first and second molding components may be comprised of the same material. In some embodiments, the first and second molding components may be comprised of different materials.

In some embodiments, the molding component may be formed by a mix reaction, heating, or exposure to UV light.

In some embodiments, the first molding component may have different shapes or structures, for example, C-shape, parallel lines, rectangular, circular, elliptical, or irregular shapes. In some embodiments, the first molding component may have a structure of a grid with multiple holes or protrusions. The holes may work as cooling windows. The grid structure may provide an even support to the PCB to increase assembly strength, and spaces for accommodating different assembly structures.

Figure 7B:
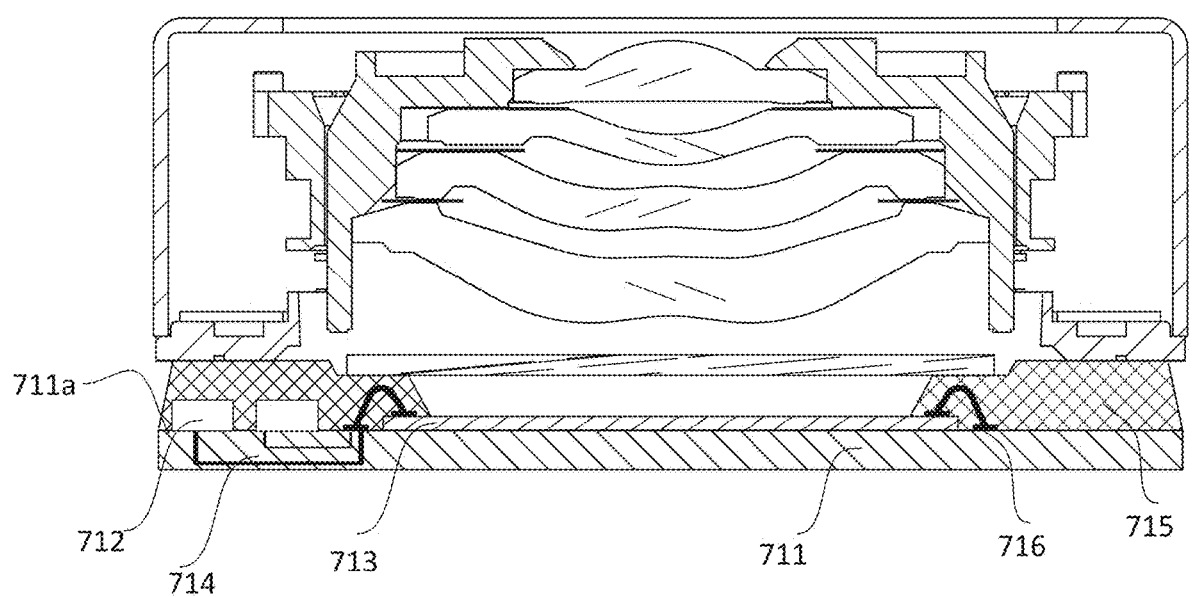

FIG. 7(b) presents another exemplary embodiment of an image-sensing device 710. As shown in FIG. 7(b), compared with the device 700, in the device 710, all electric components 712 and the photosensitive member 713 locate on the same side 711a of the PCB 711. One molding layer 715 is formed on the lens-facing surface 711a of the PCB 711. In addition, a plurality of conducting lines 714 may be configured to connecting the electric components 712 with the welding materials 716. All conducting lines 714 may enter the PCB 711, and return to the same side 711a of the PCB 711.

Figure 7C:
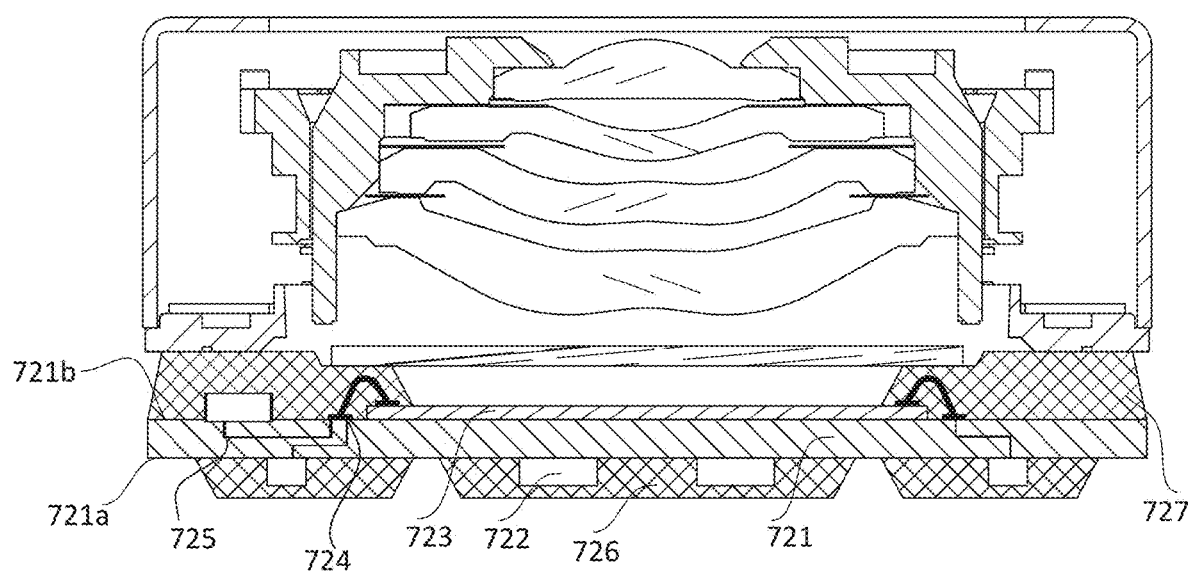

FIG. 7(c) presents another exemplary embodiment of an image-sensing device 720. Compared with the device 700, in the device 720, electric components 722 may locate on both sides (721a and 721b) of the PCB 721. A plurality of conducting lines 724 may be configured to make electrical connections among the PCB 721, the electric components 722, the welding materials 724 and the photosensitive member 723. Compared with the devices 700, 710 and 720, in the device 720, both surfaces 721a and 721b of the PCB can be utilized, and the components 722 can be arranged more compactly to reduce the size of the module. In addition, the alignment distances between the conducting lines 724 can also be reduced. A total volume (including conducting lines' thickness) occupied by the conducting lines 724 in a design of components on both sides is much smaller.

In some embodiments, an image-sensing device may include a plurality of semiconductor modules which may be arranged to provide an array of modules each having a lens assembly and associated photosensitive members and PCBs. In some embodiment, the image-sensing device includes two semiconductor modules, each semiconductor module having lens assembly of different optical properties. In some embodiment, the image-sensing device includes four semiconductor modules, at least some of which semiconductor module having lens assembly of different optical properties.

Figure 8:
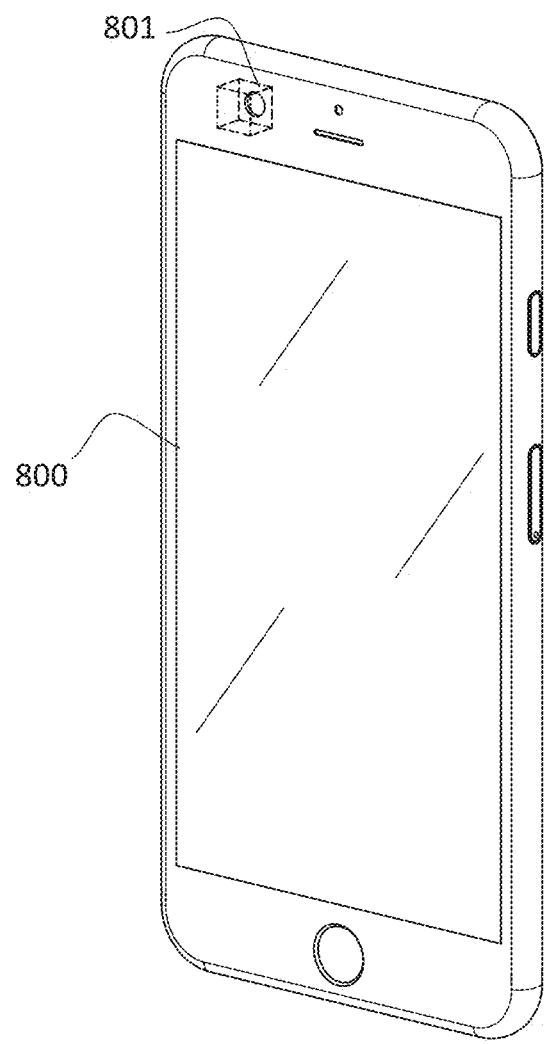
FIG. 8 is a graphical representation illustrating an exemplary application of an image-sensing device, consistent with exemplary embodiments of the present disclosure.

In some embodiments, the image-sensing device may be implemented in a mobile or stationary device which can take photos or videos. FIG. 8 shows an exemplary embodiment of an imaging-sensing device 801 implemented in a mobile phone 800. In some embodiments, the image-sensing device may also be implemented as but not limited to a tablet computer, an electronic book, an MP3/4/5, a personal digital assistant, a camera, a television set, a washing machine, a car, a train, a plane etc.

The invention described and claimed herein is not to be limited in scope by the specific preferred embodiments disclosed herein, as these embodiments are intended as illustrations of several aspects of the invention. Indeed, various modifications of the invention in addition to those shown and described herein will become apparent to those skilled in the art from the foregoing description. Such modifications are also intended to fall within the scope of the appended claims.

What is claimed is:

1. A method for manufacturing a semiconductor module for an image-sensing device, comprising:
cleaning at least a photosensitive member;
mounting conducting wires on the photosensitive member;
forming a first molding component on a first surface of a PCB, and a second molding component on a second surface of the PCB at the same time, wherein the first molding component encapsulates at least an electric component on the first surface of the PCB, and the second molding component secures the photosensitive member on the second surface of the PCB, and the second molding component comprises at least an opening on the photosensitive member to allow the light to reach the photosensitive member.

2. The method of claim 1, where the photosensitive member is electrically coupled to the PCB.

3. The method of claim 1, wherein the PCB comprises a plurality of PCB units.

4. The method of claim 3, further comprising dividing the PCB into individual PCB units.

5. The method of claim 4, further comprising assembling the PCB units into a lens assembly.

6. The method of claim 1, wherein at least a portion of the second molding component is transparent to allow at least 80% of the light to pass through the second molding component to reach the photosensitive member.

7. The method of claim 1, wherein the first and second molding components comprise a polymer.

8. The method of claim 7, wherein the polymer comprises epoxy resin.

9. The method of claim 1, wherein the first surface of the PCB comprises a first exposed area L1, and $0.1 \text{ mm} \leq L1 \leq 10 \text{ mm}$.

10. The method of claim 9, wherein the second surface of the PCB comprises a second exposed area L2, L1 and L2 do not overlap entirely, and $0.1 \text{ mm} \leq L2 \leq 10 \text{ mm}$.

* * * * *